United States Patent [19]
Proebsting

[11] Patent Number: 5,519,344
[45] Date of Patent: May 21, 1996

[54] FAST PROPAGATION TECHNIQUE IN CMOS INTEGRATED CIRCUITS

[76] Inventor: Robert J. Proebsting, 27800 Edgerton Rd., Los Altos Hills, Calif. 94022

[21] Appl. No.: 269,451

[22] Filed: Jun. 30, 1994

[51] Int. Cl.[6] ................................................ H03B 1/00
[52] U.S. Cl. ............................ 327/108; 326/17; 326/20; 326/82
[58] Field of Search ............................. 326/17, 20, 29, 326/35, 36, 82, 83; 327/108, 109, 227

[56] References Cited

U.S. PATENT DOCUMENTS

| | | | |
|---|---|---|---|
| 4,599,528 | 7/1986 | Redfield | 307/443 |
| 4,670,672 | 6/1987 | Ando et al. | 326/29 |
| 4,985,643 | 1/1991 | Proebsting | 326/17 |
| 5,061,864 | 10/1991 | Rogers | 307/443 |
| 5,149,990 | 9/1992 | Yamazaki et al. | 326/83 |
| 5,247,212 | 9/1993 | Vinal | 307/448 |
| 5,274,277 | 12/1993 | Chan | 307/443 |

FOREIGN PATENT DOCUMENTS 0348998  1/1990  European Pat. Off. ...... H01L 27/088

*Primary Examiner*—Timothy P. Callahan
*Assistant Examiner*—Jeffrey Zweizig
*Attorney, Agent, or Firm*—Townsend and Townsend and Crew

[57] ABSTRACT

A fast propagation technique for use in CMOS circuits, whereby faster signal transition at an information carrying edge of a propagating signal is achieved at a cost of slower signal transition at the opposite edge. The technique of the present invention skews a size ratio of P-channel pull-up to N-channel pull-down transistors in the CMOS circuit to obtain much faster transition at one (rising or falling) edge of the signal and slower transition at the opposite edge. The fast propagation technique of the present invention is well suited for synchronous digital CMOS circuits such as synchronous RAMs.

15 Claims, 7 Drawing Sheets

5,519,344

FAST PROPAGATION TECHNIQUE IN CMOS INTEGRATED CIRCUITS

BACKGROUND OF THE INVENTION

This invention relates in general to complementary metal-oxide-semiconductor (CMOS) integrated circuits, and in particular to a fast propagation technique in CMOS circuits using skewed logic.

A typical CMOS inverter includes a P-channel (PMOS) pull-up transistor and an N-channel (NMOS) pull-down transistor. Because PMOS is inherently weaker than NMOS, the size (i.e., channel width) of the PMOS pull-up transistor is usually made approximately 1.5 times larger than the NMOS pull-down transistor in order to minimize signal propagation time through a cascaded pair of inverter stages. Signal propagation delay time for a CMOS gate increases linearly with the fanout F of that gate. The fanout F for a given stage is defined by the ratio of the size of the load device (i.e., stage being driven) divided by the size of the driver stage. The larger the size of the transistors in a CMOS inverter, the faster the output can switch any given capacitive load. To drive a very large load with minimum delay, normal CMOS logic conventionally uses a chain of serially connected inverters that progressively grow in size, each stage having a fanout F of about three. Designing with a fanout of either lower or higher than three increases the delay to achieve a given required total fanout. At lower fanout per stage, too many stages are required, while at higher fanout per stage the delay per stage becomes excessive. Propagation delay time continues to be a critical design factor.

In some synchronous circuit applications it is possible to appreciably increase the signal propagation speed by using a technique known as post charge logic. As fully described in U.S. Pat. No. 4,985,643, post charge logic achieves much higher speed than that obtainable with normal CMOS logic circuits, and somewhat higher speed than that obtainable by the technique of the present invention. However, post charge logic has several limitations. It requires numerous feedback reset paths causing circuit layout problems. It also requires a reset time interval after each active pulse, before another pulse can be propagated. This limits the duty cycle on any pulse to 50% or less, which can be a severe limitation for many circuits including memory circuits. With a duty cycle limited to 50%, only one half of a cycle is available to develop a signal from a memory cell during a read cycle, or to force new data into a memory cell during a write cycle.

Thus, there remains a need to reduce propagation delay times in CMOS logic circuits without the limitations of post charge logic.

SUMMARY OF THE INVENTION

The present invention offers a fast propagation technique for those CMOS circuits where input information can change only at known specific times (i.e., with a known minimum time between changes). The technique can be employed in, for example, synchronous circuits where a repetitive timing event such as a clock input dictates when new information is available.

Broadly, the circuit of the present invention has a normal or standby voltage at each node which is interrupted by an information carrying pulse. The information carrying pulse is generated near the circuit input as a narrow (short duration) pulse. To propagate this pulse through the various levels of logic in the circuit with as little propagation delay as possible, the various logic stages use transistor sizes with skewed ratios. The skewing of transistor sizes in a CMOS gate achieves faster switching in one direction (information carrying leading edge) at the cost of slower switching in the other direction (reset to normal or standby voltage). Faster leading edge transitions results in faster propagation of information through the signal path. As the pulse propagates through the signal path, the slower second edge causes the pulse width to grow. With each stage of skewed logic, the pulse width increases. There is, however, an upper limit to the width of the propagating pulse equal to the minimum cycle time of the circuit. That is, the pulse must be cleared early enough to avoid any interference with a subsequent information carrying edge. The number of skewed logic stages through which the pulse propagates must therefore be limited. Accordingly, a narrow pulse may be allowed to propagate and grow in width through several early stages of the circuit, and then restart as a second narrow pulse that continues to propagate through the later stages of the circuit as it grows in width.

In one embodiment, the fast propagation technique of the present invention improves the access time for a synchronous random access memory (RAM). The fast propagation technique of the present invention is applicable in synchronous circuits because typically a repetitive timing event, such as a master clock, dictates when information is available. A pulse generator generates a narrow pulse on the information carrying edge of the master clock. The pulse propagates through the decode path that uses skewed logic. The decode path includes an address input buffer, predecoder and final decoder, all of which have skewed transistor sizes to speed up the information carrying leading edge of the signal. The output path also uses skewed logic starting from the dynamic differential sense amplifier that detects and amplifies the data received from complementary local input/output (I/O) lines. The sense amplifier receives a second narrow pulse as an activation strobe. Using inverters with skewed transistor sizes, the output of the sense amplifier is buffered onto global I/O lines. The global I/O lines feed the data to the output via an output buffer. Reduced access time is thus achieved for the synchronous RAM by using skewed logic.

A better understanding of the nature and advantages of the fast propagation technique of the present invention may be had by referring to the detailed descriptions and diagrams below.

DESCRIPTION OF SPECIFIC EMBODIMENTS

Figure 1A:
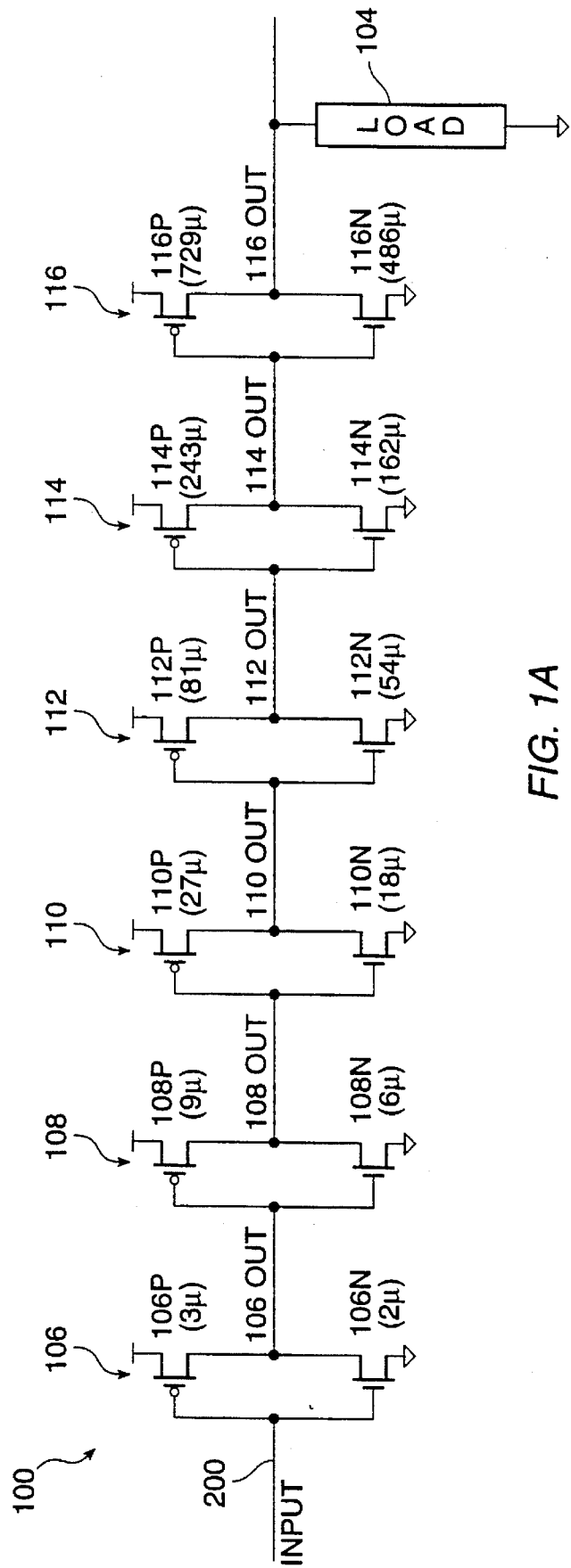
FIGS. 1A and 1B show a prior art inverter chain and an inverter chain having skewed logic according to the present invention, respectively.
Figure 1B:
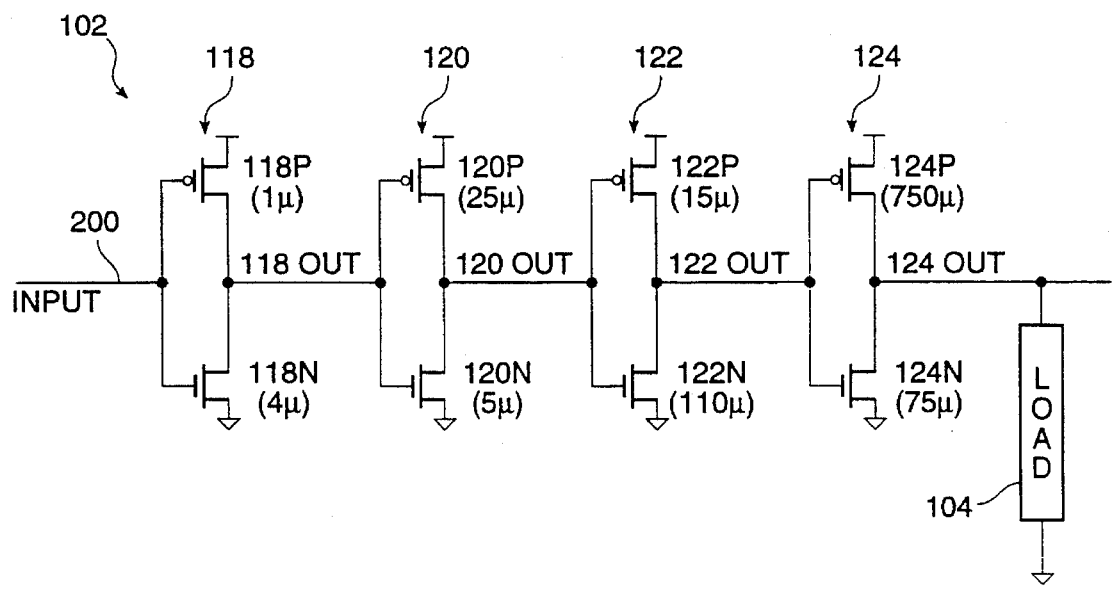

FIGS. 1A and 1B show two CMOS inverter chains 100 and 102, respectively, each driving an effective capacitive load 104 of equal value. Inverter chain 100 is a typical prior art buffering circuit with a chain of six serially connected CMOS inverters 106, 108, 110, 112, 114, and 116 having transistor sizes adjusted for minimum propagation delay for both the rising and the falling edge of the input signal 200. The width of each transistor is shown in FIGS. 1A and 1B in parentheses with PMOS transistor 106P being 3μ wide and NMOS transistor 106N being 2μ wide. In this example, the size of each inverter grows by a factor of three, starting from a PMOS/NMOS channel width ratio of 3/2 for inverter 106 to 729/486 for the last inverter 116. Defining the fanout for each individual transistor as the ratio of the sum of the transistor sizes (channel widths) of the load (i.e., total width of transistor gates being driven) divided by the size of the driver transistor yields a fanout Fp of 5 (5=[9+6]/3= [27+18]/9=[81+54]/27=etc.) for the PMOS transistors 106P, 108P, 110P, etc., and a fanout Fn of 7.5 (7.5=[9+6]/2=[27+18]/6=[81+54]/18=etc.) for the NMOS transistors 106N, 108N, 110N, etc. With equal fanout conditions, each pair of stages (one with a rising edge and one with a falling edge) exhibits the same amount of propagation delay as every other pair.

Referring to FIG. 1B, inverter chain 102 includes four serially connected CMOS inverters 118, 120, 122, and 124, all designed with skewed transistor sizes. In this example, it is assumed that information is carried by the rising edge of the input signal. Therefore transistor sizes have been skewed to speed up the propagation through the inverter chain resulting from the rising edge of the input signal. The first inverter 118 has an NMOS transistor with a size, for example, four times that of the PMOS transistor, resulting in a much faster falling transition on node 118OUT than rising transition. To achieve high speed for the fast (information carrying) path of inverter chain 102, the fanout Fn of NMOS transistor 118N is chosen to be 7.5, the same value as used for transistor 106N in FIG. 1A. The sum of channel widths for the load transistors 120P and 120N is thus designed to be 7.5 times larger than the 4μ channel width of the driver transistor 118N, for a total channel width for transistors 120P and 120N of 30 μ. To speed up the rise time of the signal at the output of inverter 120, PMOS transistor 120P is made much larger than NMOS transistor 120N. In the example shown, PMOS/NMOS transistor sizes for inverter 120 is set at 25/5. This speeds up the rise time of the signal at the output of inverter 120 at the cost of slower fall time, while maintaining a total of 30 microns for the transistor channel sizes. The same analysis applies in choosing the transistor channel widths for the two final inverters 122 and 124. In the example shown in FIG. 1B, PMOS/NMOS channel width sizes of inverters 122 and 124 are 15/110 and 750/75, respectively. The Fp for inverter 120 is 125/25=5, and the Fn for inverter 122 is 825/110=7.5.

To compare the performance of each inverter chain, assume that each consecutive pair of inverters in inverter chain 100 exhibits a propagation delay of, for example, 1 nsec. Given the same fanout for the fast path (i.e., rising edge of input) for the two inverter chains 100 and 102, the delay per pair of stages in inverter chain 102 is actually smaller than that of inverter chain 100. As the input signal 200 makes a transition from low to high, the gate to source voltage of PMOS transistors 106P and 118P of inverters 106 and 118, respectively, decreases while the gate to source voltage of NMOS transistors 106N and 118N increases. The NMOS transistors thus start to turn on and the PMOS transistors start to turn off, pulling the inverter outputs down toward ground. Initially, however, in pulling the outputs down toward ground, the NMOS transistors must fight the PMOS transistors that are not yet completely OFF. During this period, relatively strong NMOS 118N fights a much weaker PMOS 118P, as compared to NMOS 106N that fights a comparably strong PMOS 106P. Given the same capacitive fanout Fn=7.5 for the NMOS transistors, the signal 118OUT at the output of inverter 118 will therefore drop to ground faster than the signal 106OUT at the output of inverter 106. That is, for a rising input, skewed inverter 118 exhibits less delay than normal inverter 106. Similarly, when the outputs of the first inverters 106 and 118 in either chain switch low, they turn on PMOS transistors 108P and 120P and turn off NMOS transistors 108N and 120N in the following stages, respectively. Again, small NMOS transistor 120N offers little opposition to large PMOS transistor 120P, while NMOS transistor 108N initially offers substantial opposition to PMOS transistor 108P. Given the same capacitive fanout of Fp=5 for the PMOS transistors, signal 120OUT at the output of inverter 120 will therefore rise to VDD faster than signal 108OUT at the output of inverter 108. Accordingly, the average delay per pair of stages for skewed inverter chain 102 for a rising input is less than that of inverter chain 100, possibly 0.9 nsec. The total delay for inverter chain 100 is therefore equal to 3 ns (six stages of 0.5 nsec. delay each), while the total delay for a rising input for skewed inverter chain 102 is 1.8 ns (four stages of 0.45 nsec. delay each). Note that PMOS transistor 124P in final inverter 124 in inverter chain 102 is even stronger than PMOS transistor 116P in final inverter 116 in inverter chain 100. Therefore, inverter chain 102 with two less stages is capable of driving even a larger load, much faster than possible with inverter chain 100. The delay for a rising input for the skewed logic is only about 60% that of normal logic for the same total fanout.

Figure 2:
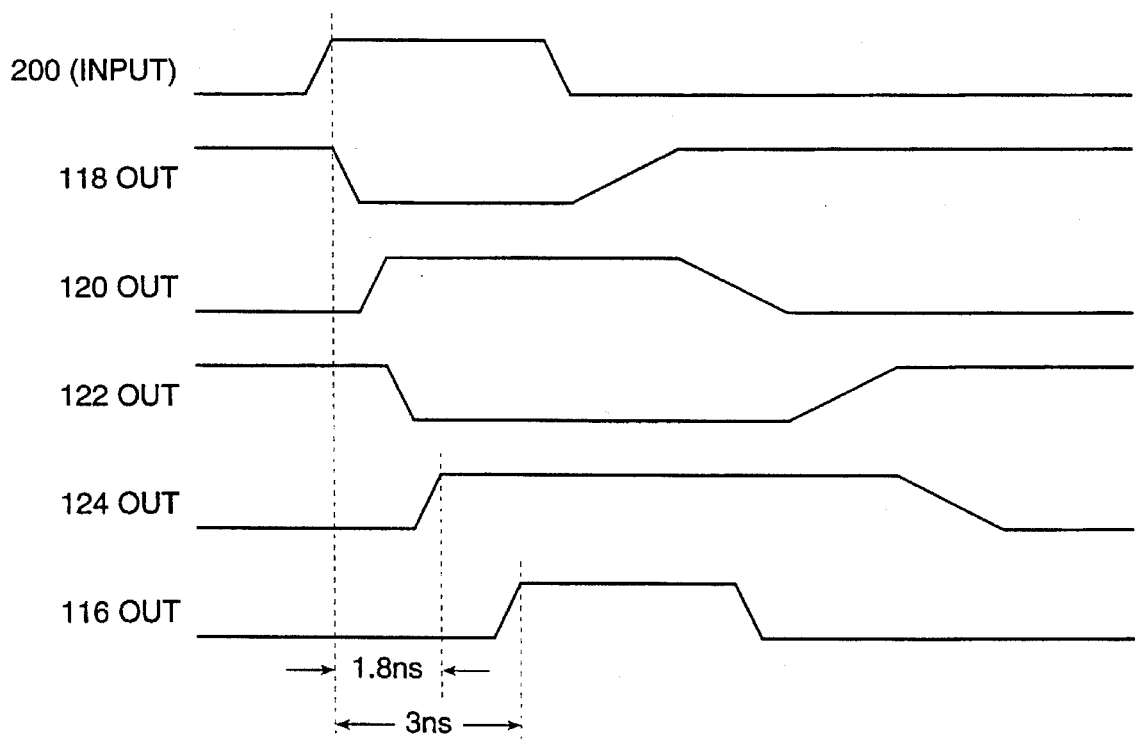
FIG. 2 is a timing diagram for the inverter chains of FIG. 1, illustrating the speed of skewed logic.

The significant increase in the speed through circuit 120 at the rising edge of the input signal, however, is realized at the expense of substantially increased delay at the falling edge of the input signal. The prior art signal path 100 exhibits equal delay for either rising or falling inputs. But signal path 102 according to the present invention is very slow in propagating a falling edge on its input. When the input switches low, PMOS transistor 118P is very slow to switch node 118OUT high for two reasons. First, PMOS transistor 118P has a very high fanout of [25+5]/1=30. Such large fanout by itself makes PMOS transistor 118P very slow. Secondly, NMOS transistor 118N continues to successfully fight PMOS transistor 118P until input 200 reaches a low enough voltage to turn off NMOS transistor 118N. Thus, node 118OUT switches high after a negative transition on the input at a considerably slower rate than does node 106OUT in circuit 100. Similarly, NMOS transistor 120N of stage 120 is very slow to pull node 120OUT low. Thus, as shown in FIG. 2, the skewed logic of circuit 102 is faster than the prior art circuit 100 on the leading (rising) edge of the input, but much slower than the prior art circuit 100 on the trailing (falling) edge of the input signal. The increased delay at the trailing edge, however, has absolutely no adverse consequences on the operation of the circuit of the present invention. That is so because the pulse is terminated before the next information carrying leading edge of a pulse occurs.

Due to the slower second edge, however, the width of the pulse grows by a considerable amount as the pulse propagates through each stage of the skewed inverter chain. As shown in FIG. 2, the positive pulse on node 124OUT is wider than the negative pulse on node 122OUT which in turn is wider than the positive pulse on node 120OUT, etc. The width of the pulse can be permitted to grow significantly without incurring any penalties, but the circuit must be designed to ensure that, even in the last stage of logic, the pulse terminates before the next information carrying edge occurs. To ensure such timely termination, the skewed logic technique of the present invention is applicable in those circuits where the information carrying edge of the signal does not occur at random times, but is limited to occurring only with known minimum time intervals between initiation of new information carrying pulse edges. This ensures that one data carrying pulse terminates before arrival of a new data carrying pulse.

For proper operation of the circuit, the designer must limit the pulse width of the signal propagating though the signal path. This can be achieved by generating a very narrow pulse at the information carrying edge of the signal using, for example, a simple one-shot circuit. Instead of the original input signal, the narrow pulse is entered into the skewed logic. As the narrow pulse propagates through the skewed logic path, its pulse width grows. When the pulse width of the signal reaches critical size (less than the minimum cycle time), the signal may once again be put through a one-shot circuit to generate a second narrow pulse which continues to propagate through additional stages of skewed logic. This regeneration of a narrow pulse can be performed as often as deemed desirable.

Figure 3:
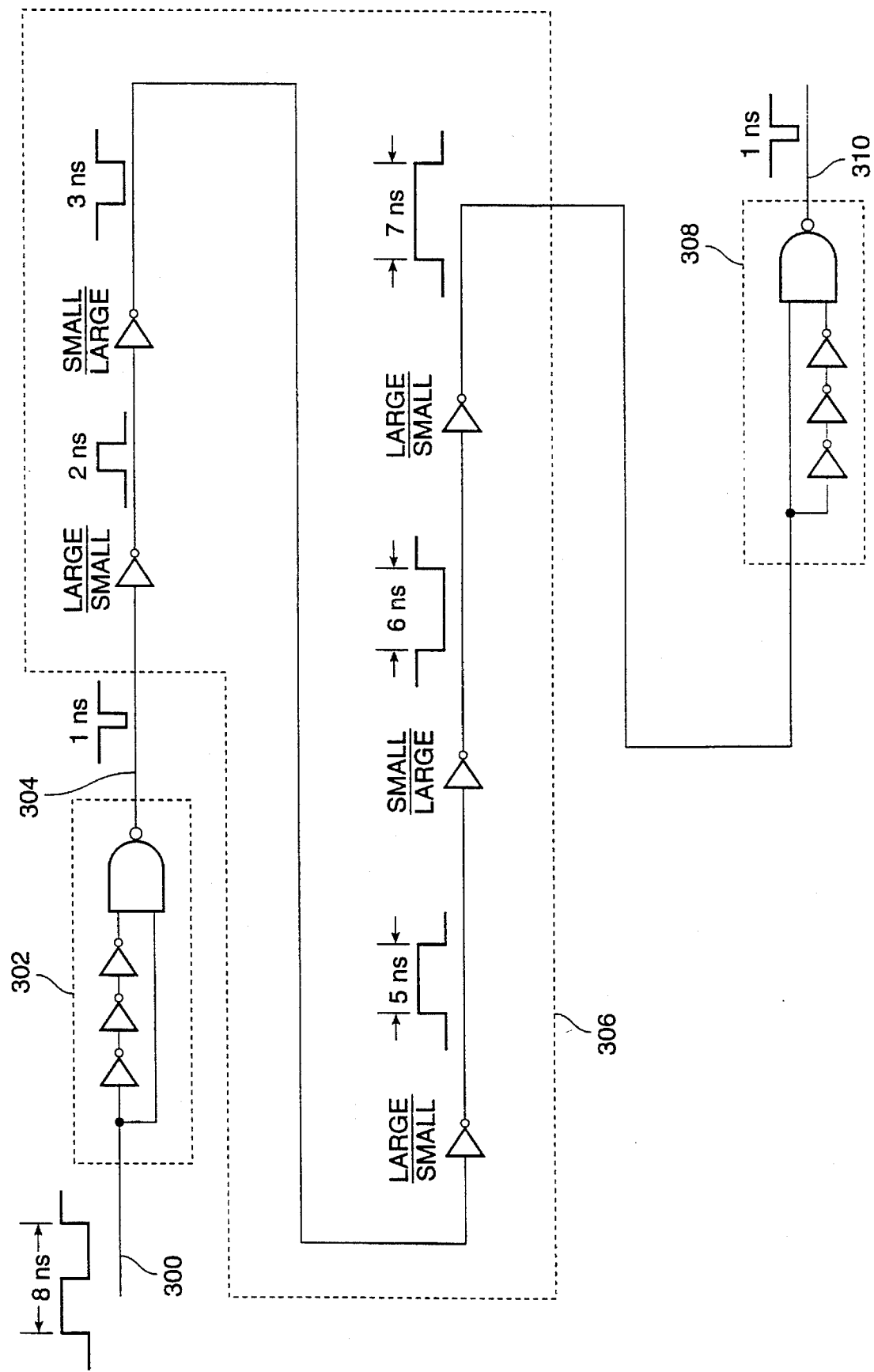
FIG. 3 shows one simple embodiment of a CMOS circuit using skewed logic according to the present invention.

FIG. 3 provides a simple example of skewed logic according to the present invention. An input signal 300 is applied to the input of a one-shot circuit 302. The output 304 of one-shot circuit 302 is a narrow negative pulse at the rising edge of the input signal. This signal propagates through several stages of skewed logic 306. In this example, the PMOS/NMOS size ratios are skewed to minimize delay through the circuit on the falling edge of the signal on node 304. The narrow pulse grows in width as it propagates through each stage of skewed logic 306. When the pulse width approaches the minimum cycle time of the input signal (i.e., time between initiation of new information carrying pulses), a second one-shot circuit 308 receives the signal at its input to generate a second narrow pulse at its output 310. This process continues until the signal reaches the output. It is to be understood that many of the skewed inverters 306 may be NAND, NOR or other logic gates in a typical application.

Figure 8:
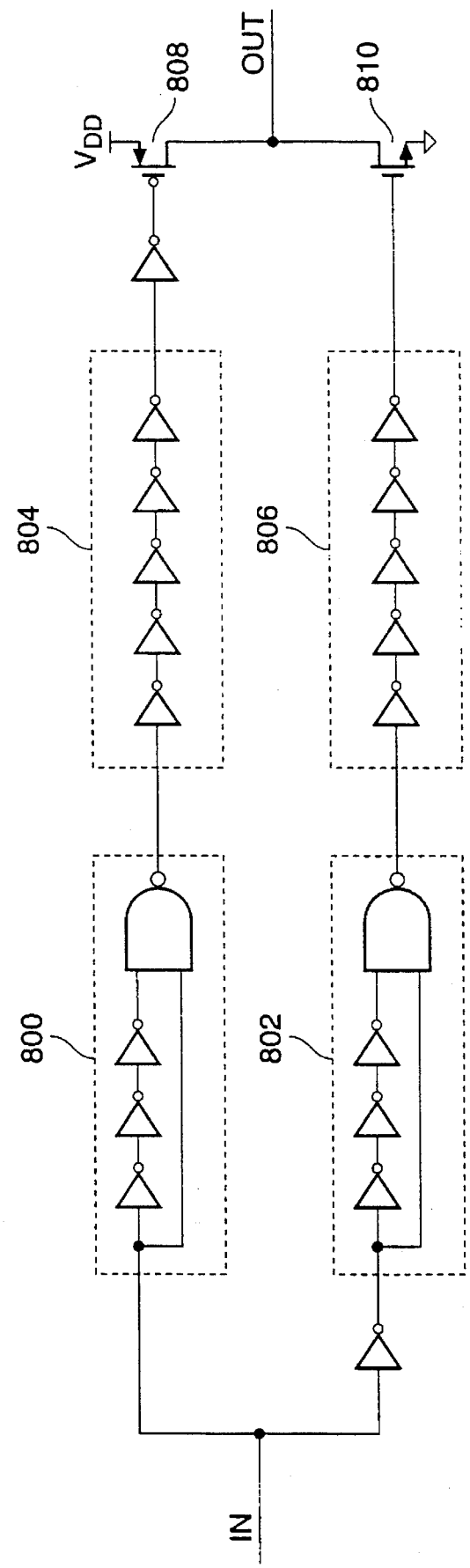
FIG. 8 shows complementary data paths for the skewed logic technique of the present invention.

The skewed logic technique of the present invention requires that data be represented by pulses on complementary or mutually exclusive data lines as opposed to voltage levels. That is, data is not transmitted through a single wire using voltage levels to distinguish between a logic "0" and a logic "1." Instead, at least two mutually exclusive wires are required such that a pulse on the true wire represents a logic "1" while a mutually exclusive pulse on the inverse wire represents a logic "0." For example, in the case of a predecoder or final decoder output in a random access memory circuit, a pulse exists on a selected one of N outputs to the exclusion of a pulse on any other output. Each pulse is allowed to propagate through a separate skewed logic path. Separate data paths are illustrated by the exemplary circuit shown in FIG. 8. An input signal and its inverse are applied respectively to the inputs of two pulse generators 800 and 802. The outputs of pulse generators 800 and 802 each go through several stages of skewed logic, 804 and 806 respectively, similar to the five inverters in block 306 of FIG. 3. The output of the true path 804 drives the gate of a PMOS pull-up transistor 808 through an inverter, while the output of the inverse path 806 drives the gate of an NMOS pull-down transistor 810 directly. The drains of PMOS transistor 808 and NMOS transistor 810 connect together to form a single output wire. A rising edge at the input results in a negative pulse at the output of one-shot 800 whose leading edge rapidly propagates through skewed logic 804 and arrives as a much wider negative pulse at the gate of PMOS transistor 808, while the gate of NMOS transistor 810 remains at logic low. This causes PMOS transistor 808 to pull output node OUT up to VDD with little total delay. A falling edge at the input results in a negative pulse at the output of one-shot 802 whose leading edge rapidly propagates through skewed logic 806 and arrives as a much wider positive pulse at the gate of NMOS transistor 810, while the gate of PMOS transistor 808 remains at logic high. This causes the output node OUT to be pulled low to ground. In some applications a small latch may be required on the output wire to indefinitely hold the data represented by the most recently received pulse. Thus, the speed advantages of the skewed logic technique of the present invention can be realized in both directions of an input signal, on a single output wire but with two separate signal paths.

This example also illustrates the requirement of a minimum time interval between the occurrence of two information carrying edges. That is, a negative transition at IN cannot be permitted to follow too closely after a positive transition, or vice versa. A very narrow pulse generated at the output of one-shot 800 grows to a substantially wider pulse at the gate of PMOS transistor 808. If a subsequent negative transition at IN occurred early enough such that NMOS transistor 810 turns on before PMOS transistor 808 turns off, the output is very slow to fall, if it falls at all, and the circuit consumes excessive power. Thus, it is critical to the skewed logic technique of the present invention that the information carrying edge of the signal does not occur at random times. There must be sufficient time allowed between information carrying pulses to allow the previous information carrying edge to have already terminated before arrival of a new, possibly opposite, information carrying edge.

A good example of an application circuit for the skewed logic technique of the present invention is a dynamic or static synchronous random access memory circuit. The design of synchronous memory circuits is based on a master clock signal. A dynamic random access memory (DRAM) cycle, such as Write or Read is initiated at the rising edge (arbitrary choice) of the clock input signal. The column addresses supplied to synchronous DRAMs are sampled on (or latched by) the rising edge of the periodic clock, and cannot change internally between clocks. A synchronous DRAM does not support a Read/Modify/Write cycle which would require maintaining column decode signal selected for a possible Write cycle after a Read operation. A single known operation (e.g., read or write) allows the use of a pulse rather than a level on the final column decode output. This combined with the periodic change in internal address allows the use of skewed logic. Thus, the speed benefits of skewed logic are realized while simultaneously achieving a wider pulse than is possible with post charge logic for read or write on the column select output. These advantages will be explained in greater detail hereinafter.

Figure 4:
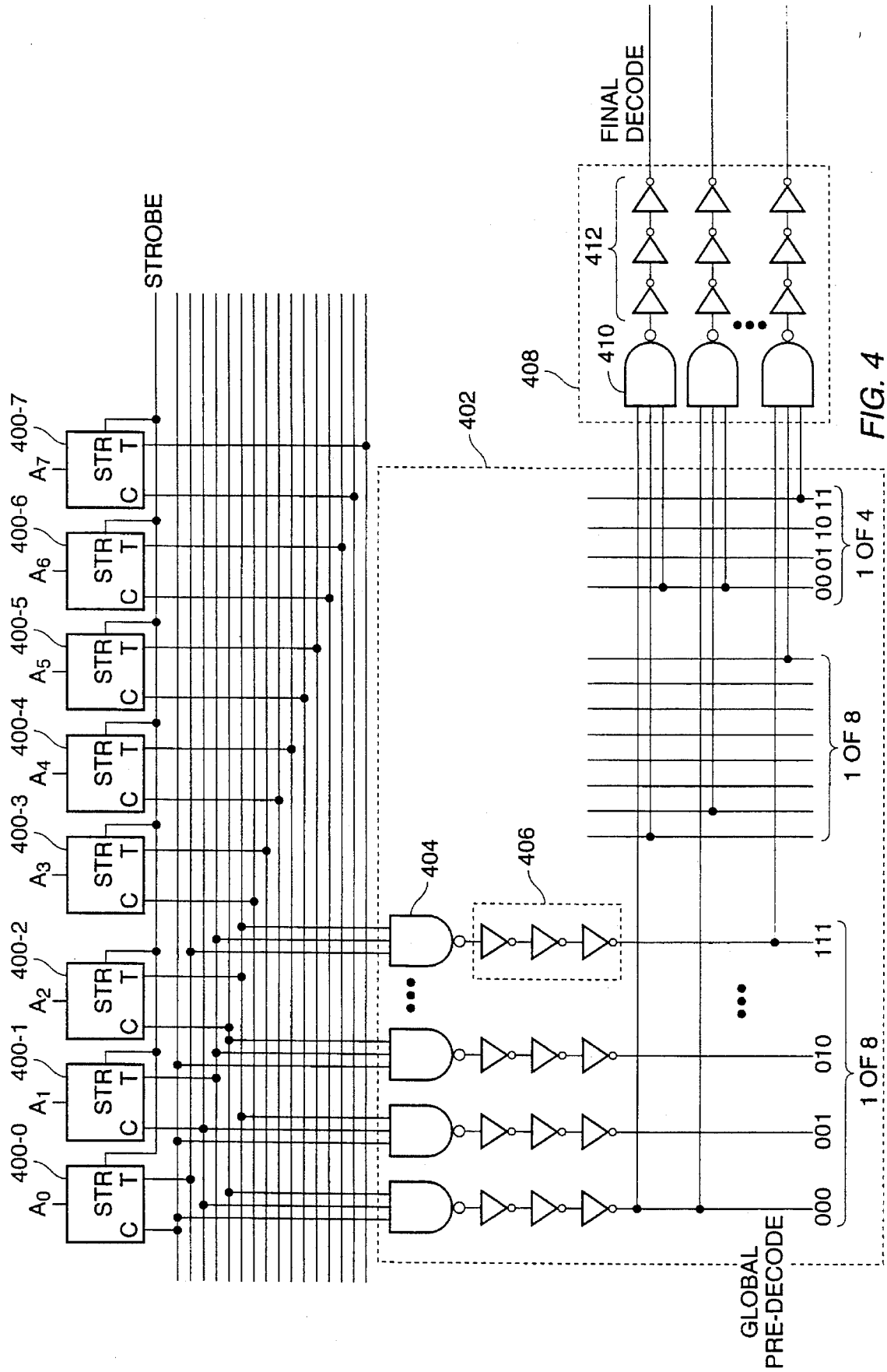
FIG. 4 is a schematic diagram of a typical decode path for a RAM.

FIG. 4 is a simplified schematic diagram of a typical decode scheme used in DRAMs. Address information having, for example, eight bits is applied to eight corresponding input buffers 400-0 to 400-7. A predecoder stage 402 divides the address bits into, for example, two groups of three bits and a group of two bits. Predecoder 402 typically includes three-input NAND gates 404 followed by a chain of driver inverters 406 that progressively grow in size. Predecoder 402 selects one of eight global predecode lines for the two three-bit groups and one of four for the two-bit group. Global predecode lines are then input to a final decode stage 408 which includes three-input NAND gates 410 followed by a chain of driver inverters 412 that progressively grow in size. The final decode stage 408 selects one of 256 to generate the final global column decode line which selects a particular column in each of many memory arrays.

Figure 5:
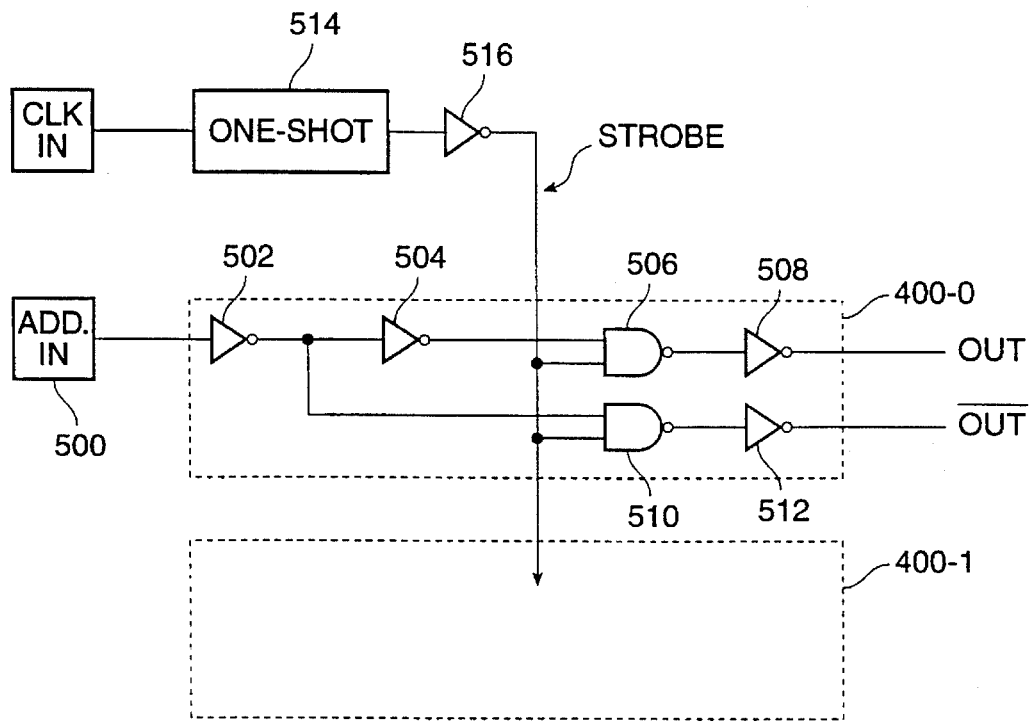
FIG. 5 is a schematic diagram of an exemplary input buffer for a synchronous RAM using the skewed logic technique of the present invention.

In synchronous DRAMs, the address at the input of the input buffers 400-0 is sampled (or latched) on a given, for example, rising edge of the master clock signal. Block 400 of FIG. 5 is a schematic diagram of an exemplary synchronous DRAM address input buffer using skewed logic according to the present invention. The address at an input pad 500 is buffered using series connected inverters 502 and 504. The output of inverter 504 connects to one input of a two-input NAND gate 506 which has an inverter 508 connected to its output. The output of inverter 508 forms the true output OUT of the input buffer circuit. The output of the first inverter 502 connects to one input of another two-input NAND gate 510 whose output connects to an input of an inverter 512. The output of inverter 512 forms the complement output $\overline{OUT}$ of the input buffer circuit. The second input of both NAND gates 506 and 510 connect together and receive a STROBE signal that latches the address by transmitting a pulse on the appropriate output line OUT or $\overline{OUT}$. A negative pulse is generated by a one-shot circuit 514 (similar to block 302 in FIG. 3) on the rising edge of the clock signal received at its input. One-shot circuit 514 is followed by an inverter 516 whose output is the STROBE signal. STROBE is a very narrow positive pulse on the rising (leading) edge of the clock input. Skewed logic is utilized in this circuit to reduce the delay for the leading edge of the address signal. Thus, NAND gates 506 and 510 have relatively large NMOS transistors and small PMOS transistors, while inverters 508 and 512 have relatively large PMOS transistors and small NMOS transistors. Inverter 516 and one-shot 514 have PMOS/NMOS transistor size ratios skewed to minimize the delay for, in this example, the rising edge of the CLK IN signal. Inverters 502 and 504 that provide for initial buffering of the address input have normal transistor size ratios since equal speed is needed for both positive and negative address input transitions.

The combination of a logical "1" (VDD) at address input 500 with a positive pulse at STROBE results in a positive pulse at OUT with $\overline{OUT}$ remaining at ground. The combination of a logical "0" (ground) at address input 500 and a positive pulse at STROBE results in a positive pulse at $\overline{OUT}$, with OUT remaining at ground. Due to the skewing of transistor sizes, however, the signal at OUT and $\overline{OUT}$ is a pulse somewhat wider than the STROBE pulse.

Figure 6:
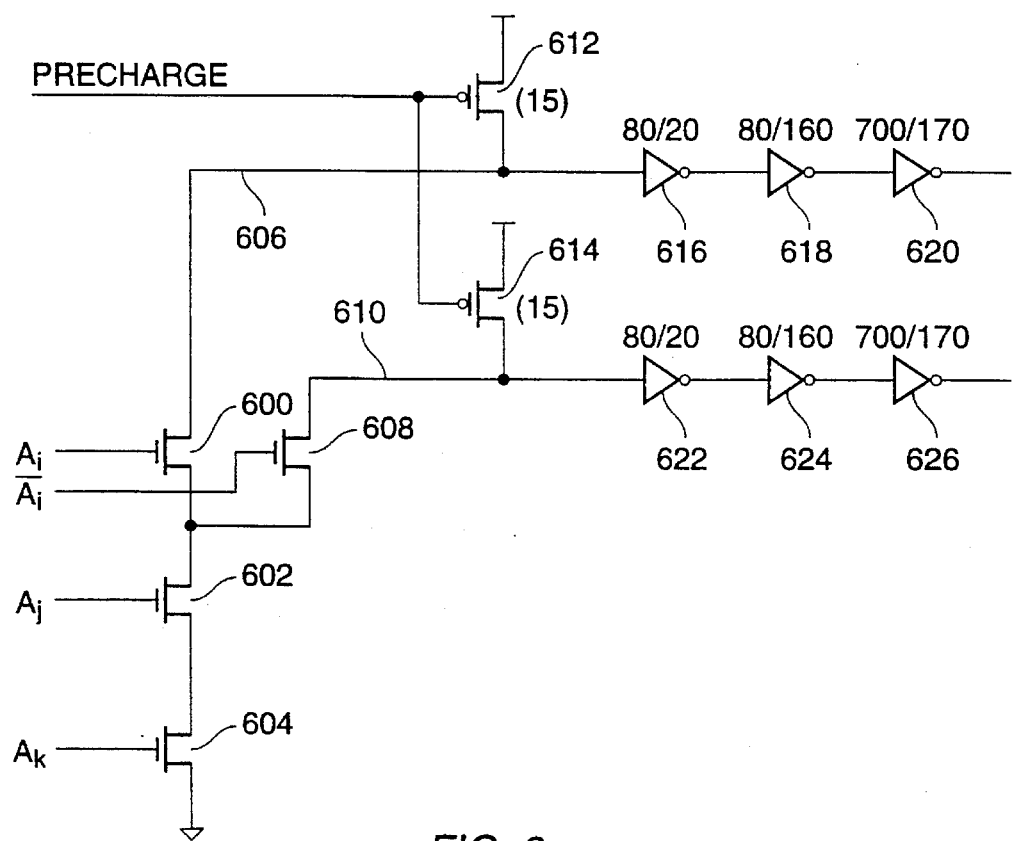
FIG. 6 is a schematic diagram of an exemplary predecoder for a synchronous RAM using the skewed logic technique of the present invention.

Address pulses on OUT or $\overline{OUT}$ feed into predecoders. FIG. 6 is an exemplary circuit schematic of a synchronous DRAM predecoder according to the present invention. Three address bits $A_i$, $A_j$, and $A_k$ connect to gate terminals of three NMOS transistors 600, 602, 604, respectively. The three NMOS transistors serially connect a precharged decode node 606 to ground, thus performing NAND logic. A fourth NMOS transistor 608 receives the complement of $A_i$ (least significant bit) at its gate terminal and connects transistors 602 and 604 to a second precharged decode node 610. Node 606 thus decodes address 111, and node 610 decodes address 110. Three other similar circuits with other values for $A_j$ and $A_k$ generate six other outputs. PMOS transistors 612 and 614 precharge decode nodes 606 and 610 to the positive supply voltage (VDD), respectively, and are off when pulses arrive on $A_i$-$A_k$. Buffering for the signal on each decode node is provided by three serially connected inverters having skewed, and progressively increasing transistor sizes. Inverters 616, 618, 620 buffer the signal from node 606 to drive the high capacitive lode on the output of inverter 620. These skewed inverter have exemplary PMOS/NMOS channel width ratios of 80/20, 80/160, and 700/170, respectively. Inverters 622, 624, 626 buffer the signal from node 610 with similar PMOS/NMOS ratios. This skewing significantly decreases the delay for the leading edge of signals at the outputs of the inverter chains.

The pulse width of the signal at the outputs however further increases due to the increased delay through the circuit on the trailing edge of the pulse. The pulse width of a global decode signal at the output of a final decoder (408 in FIG. 4) is even further increased due to similar skewing in favor of the leading edge of the pulse. The pulse width can be allowed to increase up to but not exceed the minimum cycle time for which proper operation is required. If the cycle time is equal to the stretched width of the pulse at the global decoder output, one global column select is deselected simultaneously with the selection of another. In the event the same column is selected in two successive cycles, it simply remains on for the two cycles, which is not possible with post charge logic. Thus, the skewed logic technique of the present invention allows a global column decode line to be on for as long as a full clock cycle, achieving twice the memory bandwidth for a given select time as compared to that possible with post charge logic.

Figure 7:
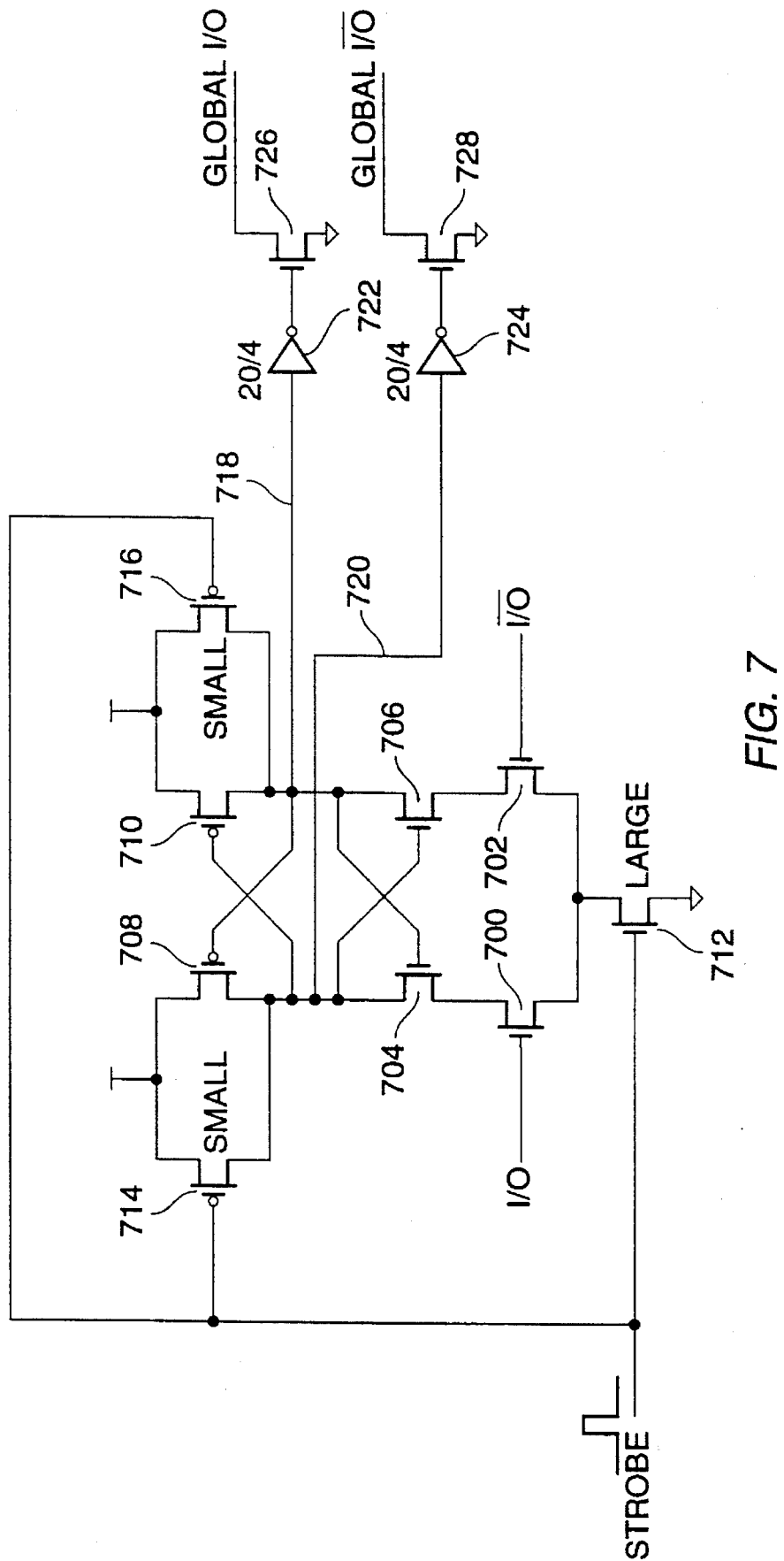
FIG. 7 is a schematic diagram of an exemplary differential sense amplifier for a synchronous RAM using the skewed logic technique of the present invention.

The global decode signal typically connects a selected pair of Bit and $\overline{Bit}$ lines to a pair of complementary local input/output (I/O) lines. Upon activation of a global decode signal in a Read cycle, the local I/O lines develop a differential signal whose polarity depends on the data stored in the selected memory cell. The local I/O lines connect to the inputs of a differential sense amplifier whose outputs generate a pulse on a true or complement global I/O line. At this location, it is convenient to reduce the pulse width of the signal by controlling the activation signal for the differential sense amplifier. FIG. 7 is a circuit schematic of an exemplary dynamic differential sense amplifier for synchronous RAMs according to the present invention. A pair of NMOS input transistors 700 and 702 receive I/O and $\overline{I/O}$ at their gate terminals respectively. A cross-coupled pair of NMOS transistors 704, 706 and a cross-coupled pair of PMOS transistors 708, 710 are connected together to perform the differential amplification. The differential amplifier is only activated on a read cycle and only after the selected column develops a differential signal on the local I/O lines. NMOS transistor 712 and PMOS transistors 714 and 716 receive the activation STROBE signal at their gate terminals to allow the amplifier to sense the differential inputs. Thus, the sense amplifier is strobed with a newly generated narrow pulse late in the relatively long period during which the column line remains selected, and during which time a differential voltage slowly develops on the I/O lines.

Before generation of the narrow positive pulse, a logical low at the strobe inputs brings both outputs of the amplifier at nodes 718 and 720 up to VDD. When the narrow positive pulse arrives, PMOS transistors 714 and 716 turn off and NMOS transistor 712 turns ON. This allows the cross-coupled transistors to start the regenerative process such that when I/O is at a more positive voltage than $\overline{I/O}$, it rapidly brings output node 720 to ground and leaves its complement node 718 at VDD. If $\overline{I/O}$ is at a more positive voltage than I/O when STROBE pulse arrives, then the cross-coupled transistors bring node 718 to ground and leave node 720 at VDD. The skewed logic technique can be utilized inside the amplifier by making the NMOS pull-down transistor 712 large compared to the PMOS pull-up transistors 714 and 716. Thus, one output 718 or 720 will have a negative pulse with a very fast falling edge and a slower rising edge. The width of the negative pulse on node 718 or 720 is equal to the strobe pulse width plus the pulse stretching caused by slow PMOS pull-up transistors 714, 716 compared to the strong NMOS transistor 712. Two inverters 722, 724 with skewed PMOS/NMOS transistor sizes of, for example, 20/4 drive each output node, respectively. Once again, by making the PMOS substantially larger than the NMOS, the rise time of the signals at the output of each inverter is greatly reduced. These signals connect to the precharged global I/O and $\overline{I/O}$ lines via pull-down transistors 726 and 728, respectively. The skewed logic technique can be employed in this fashion throughout the I/O path in synchronous RAMs to achieve faster access times than that possible with normal unskewed circuits.

In conclusion, the present invention provides a fast propagation technique for CMOS circuits. By skewing the transistor sizes of the CMOS circuit, the technique of the present invention speeds up the information carrying edge of the propagating signal at the cost of slower opposite edge. This speeds up the access time of the circuit compared to that possible using normal (unskewed) logic stages. The technique can be employed in those CMOS circuits where information can not change at random times, but instead changes only at known specific times. A good example of an application for the technique of the present invention is a CMOS synchronous DRAM or SRAM circuit where access time is one of the most critical design considerations. The skewed logic technique of the present invention allows a column select line to be on for a full clock cycle, thus significantly increasing the memory time available to write or to develop a signal for read as compared to that available with post charge logic.

While the above is a complete description of specific embodiments of the present invention, various modifications, variations and alternatives may be employed. Therefore, the scope of this invention should not be limited to the embodiments described, and should instead be defined by the following claims.

What is claimed is:

1. In a complementary metal oxide semiconductor (CMOS) circuit wherein input data changes only at pre-defined times, a fast propagation circuit comprising:
   a pulse generator for receiving the input signal at an input, and for generating at an output a narrow pulse on an information carrying edge of the signal; and
   a logic circuit having a plurality of logic stages, each logic stage having a P-channel pull-up transistor and an N-channel pull-down transistor responsive to the narrow pulse, the P-channel and N-channel transistors having channel sizes ratioed to obtain fast signal transition for the information carrying edge of the signal and slow signal transition for an opposite edge,
   wherein, the slow signal transition causes the pulse width of the signal to grow progressively as the signal propagates through the plurality of logic stages of the logic circuit.

2. The fast propagation circuit of claim 1, further comprising a second pulse generator for receiving an output of a first part of the logic circuit at an input, and for generating a second narrow pulse at the information carrying edge of the signal, the second narrow pulse propagating through a remaining part of the logic circuit.

3. The fast propagation circuit of claim 2 wherein the first and second pulse generator are each one-shot circuits.

4. In a CMOS synchronous random access memory circuit wherein a master clock signal defines a memory cycle and wherein input information changes only at pre-defined times according to the master clock, a fast propagation circuit comprising:
   a pulse generator for receiving the master clock signal at an input and for generating a narrow pulse at an information carrying edge of the master clock signal; and
   an address input buffer for receiving address information at an input, the address input buffer being strobed by the narrow pulse to regenerate the address information as a narrow pulse at one of a complementary pair of output terminals,
   wherein, the address input buffer includes a first CMOS stage including a P-channel pull-up transistor and an N-channel pull-down transistor each receiving the narrow pulse at a gate terminal, wherein sizes of the P-channel and N-channel transistors are ratioed to obtain fast signal transition in the information carrying edge of the clock signal and slow signal transition in an opposite edge.

5. The circuit of claim 4 wherein the input buffer further comprises a CMOS inverter having an input coupled to an output of the first CMOS stage for driving the output of the address input buffer, wherein transistor sizes of the inverter are ratioed to obtain fast signal transition in the information carrying edge of the clock signal and slow signal transition in an opposite edge.

6. The circuit of claim 5 further comprising an address decode path having an input coupled to the output of the address input buffer, the address decode path including a decode stage using CMOS logic with skewed transistor sizes to obtain fast signal transition in the information carrying edge of the clock signal and slow signal transition in an opposite edge.

7. The circuit of claim 6 further comprising:
   a second pulse generator for receiving the master clock signal at an input and for generating a second narrow pulse at an information carrying edge of the clock signal; and
   a differential sense amplifier having a first and a second input coupled to a complementary pair of local input/output signals, the differential sense amplifier being strobed by the second narrow pulse to generate an output having a narrow pulse width.

8. The circuit of claim 7 wherein the differential sense amplifier further comprises a P-channel pull-up transistor and an N-channel pull-down transistor each receiving the second narrow pulse at a gate terminal, wherein sizes of the P-channel and N-channel transistors are ratioed to obtain at an output fast signal transition in the information carrying edge of the clock signal and slow signal transition in an opposite edge.

9. The circuit of claim 8 wherein the differential sense amplifier further comprises a CMOS inverter having an input coupled to the output of the differential sense amplifier for driving the output, wherein transistor sizes of the inverter are ratioed to obtain fast signal transition in the information carrying edge of the clock signal and slow signal transition in an opposite edge.

10. In a CMOS synchronous random access memory circuit wherein a master clock signal defines a memory cycle and wherein input information changes only at pre-defined times according to the master clock, a fast propagation circuit comprising:

a pulse generator for receiving the master clock signal at an input and for generating a narrow pulse at an information carrying edge of the master clock signal;

an address input buffer for receiving address information an input;

an address decode path having an input coupled to an output of the address input buffer, the address decode path including a decode stage using CMOS logic with skewed transistor sizes to obtain fast signal transition in the information carrying edge of the clock signal and slow signal transition in an opposite edge.

11. In a CMOS synchronous random access memory circuit wherein a master clock signal defines a memory cycle and wherein input information changes only at pre-defined times according to the master clock, a fast propagation circuit comprising:

an address input buffer for receiving address information at an input;

an address decoder having an input coupled to an output of the address input buffer, and an output for selecting a memory cell in response to the address information, and for coupling a content of the memory cell to a complementary pair of input/output lines;

a pulse generator for generating a narrow pulse at an output, the narrow pulse occurring after a differential signal is developed on the complementary pair of input/output lines; and a differential sense amplifier having a first and a second input coupled to the complementary pair of input/output lines, the differential sense amplifier being strobed by the narrow pulse to generate an output having a narrow pulse width.

12. The circuit of claim 11 wherein the differential sense amplifier further comprises a P-channel pull-up transistor and an N-channel pull-down transistor each receiving the second narrow pulse at a gate terminal, wherein sizes of the P-channel and N-channel transistors are ratioed to obtain at an output fast signal transition in the information carrying edge of the clock signal and slow signal transition in an opposite edge.

13. In a complementary metal oxide semiconductor (CMOS) circuit, a method for increasing the speed of signal propagation comprising the steps of:

(a) generating a narrow pulse at an information carrying edge of a signal;

(b) applying the narrow pulse to a logic gate of the CMOS circuit; and (c) for a plurality of logic stages in the CMOS circuit, skewing transistor size ratio of a P-channel pull-up transistor to an N-channel pull-down transistor in each logic stage to obtain fast signal transition at the information carrying edge of the signal and slow signal transition at an opposite edge;

(d) allowing the width of the narrow pulse to grow as it propagates through the plurality of logic stages in the CMOS circuit.

14. The method of claim 13 further comprising the steps of:

(d) widening a pulse width of the signal as it propagates through the skewed CMOS circuit;

(e) generating a second narrow pulse at an information carrying edge of the signal to again reduce a pulse width of the signal; and (f) continuing to propagate the second narrow pulse through the CMOS circuit.

15. A complementary metal oxide semiconductor (CMOS) circuit wherein information on a first node changes only at pre-defined times, the CMOS circuit comprising:

a first pulse generator having an input coupled to the first node, the first pulse generator generating a first pulse at an output in response to a positive transition of the information on the first node;

a second pulse generator having an input coupled to the first node, the second pulse generator generating a second pulse at an output in response to a negative transition of the information on the first node;

a first path of logic gates having an input coupled to the output of the first pulse generator, the first path of logic gates including PMOS and NMOS transistor size ratios skewed to minimize propagation delay of a positive edge of the information on the first node; and a second path of logic gates having an input coupled to the output of the second pulse generator, the second path of logic gates including PMOS to NMOS transistor size ratios skewed to minimize propagation delay of a negative edge of the information on the first node;

wherein, a pulse at an output of the first logic path sets a state of a second node to a first logic level, and a pulse at an output of the second logic path sets the state of the second node to a second logic level.

* * * * *